US010381064B1

United States Patent
Morohashi

(10) Patent No.: US 10,381,064 B1
(45) Date of Patent: Aug. 13, 2019

(54) APPARATUSES AND METHODS FOR REFRESHING MEMORY OF A SEMICONDUCTOR DEVICE

(71) Applicant: MICRON TECHNOLOGY, INC., Boise, ID (US)

(72) Inventor: Masaru Morohashi, Hachioji (JP)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 15/875,985

(22) Filed: Jan. 19, 2018

(51) Int. Cl.
  *G11C 11/406*  (2006.01)
  *G11C 11/408*  (2006.01)
  *G11C 11/4074* (2006.01)
  *G11C 11/4076* (2006.01)

(52) U.S. Cl.
  CPC .... *G11C 11/40615* (2013.01); *G11C 11/4087* (2013.01); *G11C 11/4074* (2013.01); *G11C 11/4076* (2013.01)

(58) Field of Classification Search
  None
  See application file for complete search history.

(56) References Cited

U.S. PATENT DOCUMENTS

| | | | | |
|---|---|---|---|---|
| 5,670,993 A * | 9/1997 | Greene | G09G 5/39 | 345/556 |
| 6,005,823 A * | 12/1999 | Martin | G11C 7/1039 | 365/200 |
| 6,438,055 B1 * | 8/2002 | Taguchi | G11C 11/406 | 365/222 |
| 9,373,422 B1 * | 6/2016 | Kwean | G11C 29/808 | |
| 2003/0043672 A1 * | 3/2003 | Inoue | G11C 11/406 | 365/222 |
| 2003/0086311 A1 * | 5/2003 | Benedix | G11C 11/406 | 365/200 |
| 2006/0198207 A1 * | 9/2006 | Ishikawa | G11C 11/406 | 365/189.07 |
| 2009/0213671 A1 * | 8/2009 | Koo | G11C 29/81 | 365/200 |
| 2011/0194367 A1 * | 8/2011 | Wong | G11C 7/02 | 365/200 |

\* cited by examiner

*Primary Examiner* — Douglas King
(74) *Attorney, Agent, or Firm* — Dorsey & Whitney LLP

(57) ABSTRACT

Apparatuses and methods for refreshing memory of a semiconductor device are described. An example method includes producing, responsive to a first refresh command, a plurality of first refresh addresses and detecting, responsive to the plurality of first refresh addresses, that the plurality of first refresh addresses include a first defective address and a first non-defective address. The example method further includes refreshing, responsive to a second refresh command following the first refresh command, the non-defective first address without refreshing the first defective address.

13 Claims, 5 Drawing Sheets

APPARATUSES AND METHODS FOR REFRESHING MEMORY OF A SEMICONDUCTOR DEVICE

BACKGROUND

Dynamic random access memory (DRAM) include volatile memory cells that may be used to store data. However, in order to maintain the stored data, the memory cells are periodically refreshed to restore the data being stored. The memory cells are typically refreshed by sequencing through groups of memory cells associated with respective refresh addresses. The refresh address may be generated internally, and the refresh operations for the memory cells corresponding to the refresh address performed in response to refresh commands.

Refreshing the memory cells consume power. In low power applications, reducing power consumption from refresh operations may be beneficial. Therefore, it may be desirable to have refresh operations that may have reduced power consumption.

DETAILED DESCRIPTION

Certain details are set forth below to provide a sufficient understanding of examples of the disclosure. However, it will be clear to one having skill in the art that examples of the disclosure may be practiced without these particular details. Moreover, the particular examples of the present disclosure described herein should not be construed to limit the scope of the disclosure to these particular examples. In other instances, well-known circuits, control signals, timing protocols, and software operations have not been shown in detail in order to avoid unnecessarily obscuring the examples of the disclosure. Additionally, terms such as "couples" and "coupled" mean that two components may be directly or indirectly electrically coupled. Indirectly coupled may imply that two components are coupled through one or more intermediate components.

Figure 1:
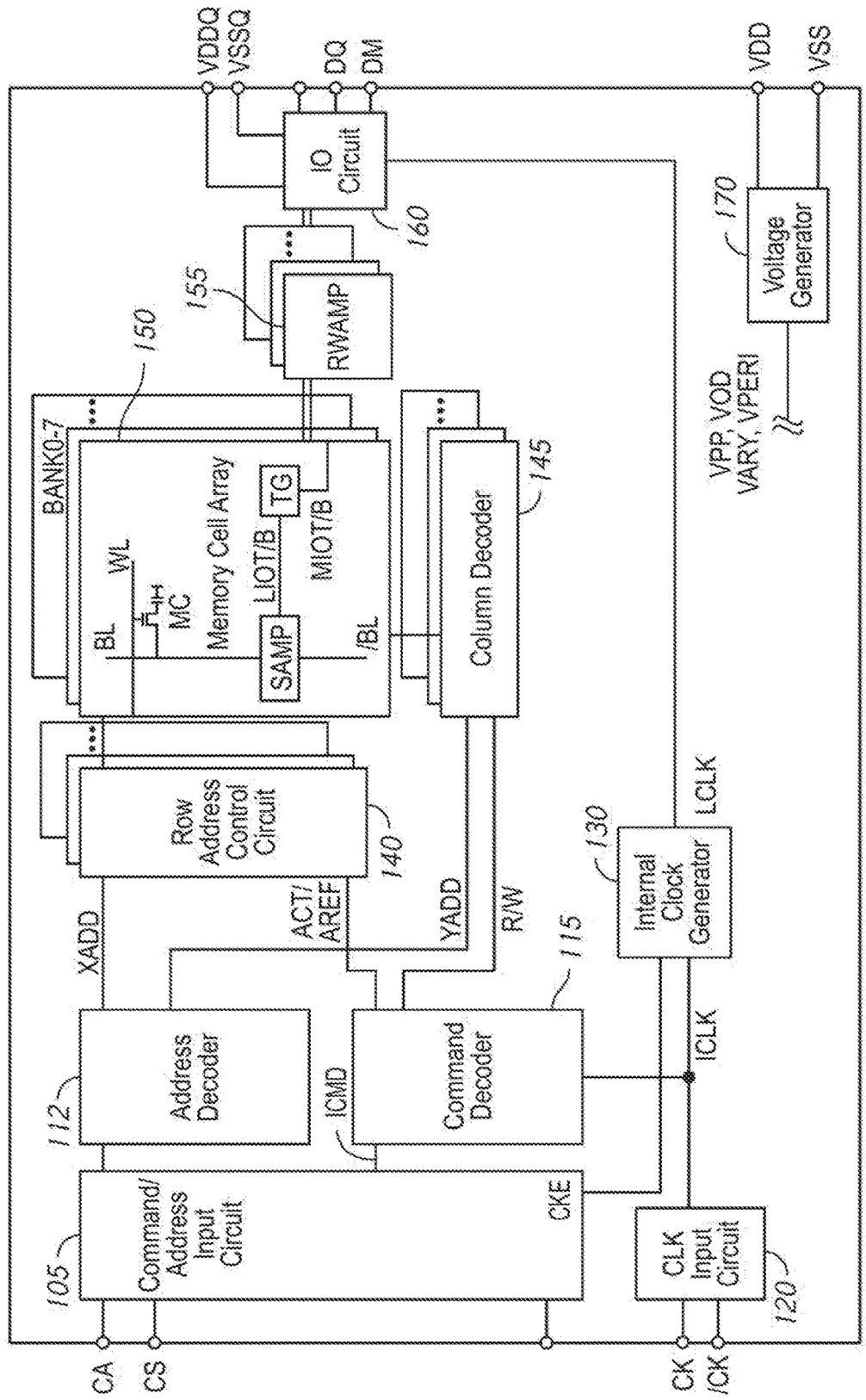
FIG. 1 is a block diagram of an apparatus according to an embodiment of the disclosure.

FIG. 1 is a block diagram of an apparatus according to an embodiment of the disclosure. The apparatus may include a semiconductor device 100, and will be referred as such. In some embodiments, the semiconductor device 100 may include, without limitation, a DRAM device, such as low power DDR (LPDDR) memory integrated into a single semiconductor chip, for example. The semiconductor device 100 includes a memory array 150. The memory array 150 includes a plurality of banks, each bank including a plurality of word lines WL, a plurality of bit lines BL and /BL, and a plurality of memory cells MC arranged at intersections of the plurality of word lines WL and the plurality of bit lines BL. The memory cells MC are volatile memory cells, requiring periodic refreshing in order to maintain the data stored in the memory array.

The selection of the word line WL is performed by a row address control circuit 140 and the selection of the bit line BL is performed by a column decoder 145. Sense amplifiers (SAMP) are located for their corresponding bit lines BL and /BL coupled to at least one respective local I/O line pair (LIOT/B), which is in turn coupled to at least one respective main I/O line pair (MIOT/B), via transfer gates (TG), which function as switches.

The memory array 150 may include a regular array and a redundant array. The regular array includes memory cells that are typically used to store data with the memory cells corresponding to respective memory addresses. The redundant array includes memory cells that may be used to "repair" defective memory cells of the regular array. The memory cells may be configured as redundant rows of memory and redundant columns of memory. The redundant rows of memory may be used to repair rows of memory of the regular array, and the redundant columns of memory may be used to repair columns of memory of the regular array. The redundant memory are used to repair defective memory cells of the regular array by having the memory addresses corresponding to the defect memory cells mapped to memory cells of the redundant array. As a result, when the memory address for the defective memory location is provided to the semiconductor device 100, the memory location in the redundant array to which the memory address is mapped is accessed instead of the defective memory location in the regular array corresponding to that memory address.

The semiconductor device 100 may employ a plurality of external terminals, which include command/address terminals CA that are coupled to a command and address bus to receive commands and addresses. The plurality of external terminals further includes clock terminals CK and CK/to receive clock signals, data terminals DQ and data mask terminals DM, and power supply terminals VDD, VSS, VDDQ, and VSSQ.

The command/address terminals CA may be supplied with memory addresses, for example, from a memory controller. The memory addresses supplied to the command/address terminals CA are transferred, via a command/address input circuit 105, to an address decoder 112. The address decoder 112 receives the memory addresses and supplies decoded row addresses XADD to the row address control circuit 140, and supplies decoded column addresses YADD to the column decoder 145.

The command/address terminals CA may further be supplied with commands from, for example, a memory controller. The commands may be provided as internal command signals ICMD to a command decoder 115 via the command/address input circuit 105. The command decoder 115 includes circuits to decode the internal commands ICMD to generate internal commands and signals for performing operations. For example, the command decoder 115 may provide activation commands ACT and refresh commands AREF to the row address control circuit 140 to select a word line and may provide read/write commands R/W to the column decoder 145 to select a bit line. Refresh commands AREF may be provided by the command decoder 115 to the row control circuit 140 when a refresh operation is to be performed. The refresh command AREF may represent auto refresh commands that result from the semiconductor device 100 receiving a refresh command, and may also represent self refresh commands, which are generated internally when the semiconductor device 100 is set in a self refresh mode.

When a read command is received and a memory address is timely supplied with the read command, read data is read from a memory cell in the memory array 150 designated by the memory address. The read data is output to outside from the data terminals DQ via read/write amplifiers 155 and the input/output circuit 160. When a write command is received and a memory address is timely supplied with the write command, write data and a data mask (when applicable) are supplied to the data terminals DQ and DM, and the write data is written to a memory cell in the memory array 150 designated by the memory address. The write data is received by data receivers in the input/output circuit 160, and supplied via the input/output circuit 160 and the read/write amplifiers 155 to the memory array 150.

During the access operations for read and write commands, the row address control circuit 140 may include circuits for determining whether a memory address has been mapped to memory locations in the redundant array, for example, when a memory address corresponding to a defective memory location in the regular array has been mapped to memory locations of the redundant array (e.g., a redundant row of memory). The memory addresses that have been remapped are stored, and memory addresses associated with access operations are compared with the stored memory addresses. The memory addresses that have been mapped to redundant memory may be stored in nonvolatile storage. An example of a nonvolatile storage are fuse circuits (as well as antifuse circuits) that are programmed with the memory addresses to be stored. When a memory address associated with an access operation matches a stored memory address, memory locations in the redundant array are accessed instead of the memory locations in the regular array.

As previously described, the volatile memory cells are periodically refreshed in order to maintain the data stored by the memory array. The memory cells are typically refreshed as rows of memory cells. The row address control circuit 140 may include a refresh control circuit that is used during refresh operations. Refresh operations are performed when active refresh commands AREF are provided to the row address control circuit 140. Each refresh command AREF results in memory locations associated with a refresh address to be refreshed. In some embodiments of the disclosure, the refresh address may be generated internally in the semiconductor device 100. Similar circuits and operation may be included in the column decoder 145 in some embodiments of the disclosure.

A refresh address may have several memory locations associated with it. For example, multiple rows of memory may be associated with a refresh address, with each of the rows of memory corresponding to a value that when combined with the refresh address identifies the particular row of memory. Such an arrangement may facilitate faster access and refresh operations.

When refreshing the memory, the refresh addresses are determined whether to be mapped to redundant memory locations in the redundant array. In cases where a refresh address has been mapped to redundant memory, the memory locations in the regular array corresponding to the refresh address are not refreshed, thereby avoiding unnecessary refresh operations to memory locations that are not used, for example, when the regular memory locations are defective and the corresponding memory address has been mapped to redundant memory locations. Likewise, redundant memory locations that are not used are also not refreshed, such as when a redundant memory location is defective, or does not have a memory address mapped to it. Skipping refresh operations for memory locations that are not used may reduce power consumption compared to performing refresh operations to all memory locations, regardless of their use.

Turning to an explanation of the external terminals included in the semiconductor device 100, the clock terminals CK and/CK are supplied with complementary external clock signals. The external clock signals may be supplied to a clock input circuit 120. The clock input circuit 120 may generate internal clock signals ICLK. The internal clock signals ICLK are supplied to internal clock generator circuit 130 and to the command decoder 115. When enabled by clock enable CKE from the command/address input circuit 105, circuits of the internal clock generator circuit 130 provide various internal clock signals LCLK based on the internal clock signals ICLK. The internal clock signals LCLK may be used for timing the operation of various internal circuits. For example, the LCLK signals may be provided to the input/output circuit 160 for timing the operation of the input/output circuit 160 to provide and receive data on the data terminals DQ.

The power supply terminals VDD and VSS are supplied with power supply potentials. These power supply potentials are supplied to an internal voltage generator circuit 170. The internal voltage generator circuit 170 generates various internal potentials VPP, VOD, VARY, VPERI, and the like based on the power supply potentials provided to the power supply terminals VDD and VSS. The internal potential VPP is mainly used in the row address control circuit 140, the internal potentials VOD and VARY are mainly used in the sense amplifiers SAMP included in the memory array 150, and the internal potential VPERI is used in many other peripheral circuit blocks.

The power supply terminals VDDQ and VSSQ are also supplied with power supply potentials. The power supply potentials are supplied to the input/output circuit 160. The power supply potentials provided to the power supply terminals VDDQ and VSSQ may be the same potentials as the power supply potentials provided to the power supply terminals VDD and VSS in some embodiments of the disclosure. Dedicated power supply potentials are provided to the power supply terminals VDDQ and VSSQ so that power supply noise generated by the input/output circuit 160 does not propagate to the other circuit blocks.

Figure 2:
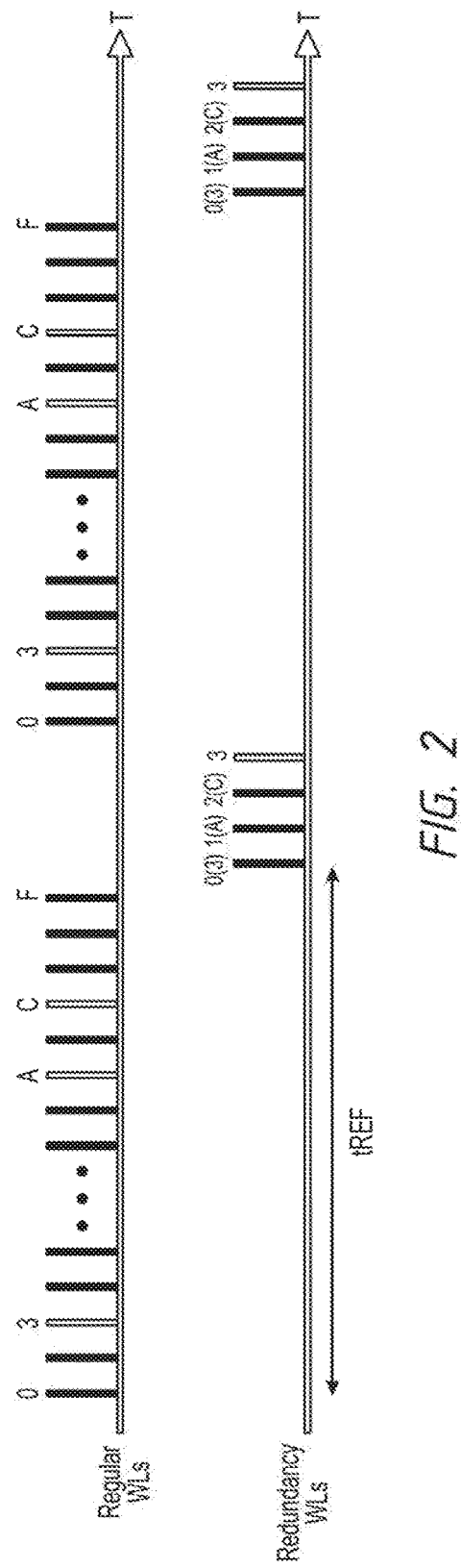
FIG. 2 is a diagram of refresh operations according to an embodiment of the disclosure.

FIG. 2 is a diagram of refresh operations according to an embodiment of the disclosure. The refresh operations of FIG. 2 may be used to refresh memory locations of the memory array 150 of the semiconductor device 100 of FIG. 1 in some embodiments of the disclosure.

FIG. 2 shows refresh operations performed for memory locations of a regular array and for memory locations of a redundant array. In the example of FIG. 2, the memory locations that are refreshed by a refresh operation are associated with a word line. Sixteen word lines (WL0-WLF) are included in the regular array and four word lines are included in the redundant array for the example of FIG. 2. Greater or fewer word lines may be included in the regular and/or redundant arrays without departing from the scope of the disclosure.

Each refresh operation performed in the regular and redundant arrays is represented in FIG. 2 by a dark vertical line. Refresh operations are performed responsive to a refresh command. For example, with reference to the semiconductor device 100 of FIG. 1, the refresh command AREF may be provided by the command decoder 115 to the row address control circuit 140. Refresh operations are performed for memory locations of the regular array over refresh period tREF, and are then followed by refresh operations for memory locations of the redundant array. The refreshing of memory locations for the regular array and then for the redundant array is repeated if necessary.

Skipped refresh operations are represented in FIG. 2 as lighter vertical lines. For example, refresh operations for wordlines WL3, WLA, and WLC of the regular array are skipped in the example of FIG. 2. The wordlines WL3, WLA, and WLC may be skipped when, for example, the memory addresses corresponding to the wordlines WL3, WLA, and WLC have been mapped to memory locations in the redundant array, such as when the memory locations in the regular array corresponding to wordlines WL3, WLA, and WLC are defective. In the example of FIG. 2, WL3, WLA, and WLC are mapped to WL0, WL1, and WL2 of the redundant array, respectively. Refresh operations for memory locations of the redundant array may also be skipped. For example, refresh operations for wordline WL 3 of the redundant array is skipped. The wordline WL 3 of the redundant array may be skipped when, for example, when the memory locations of wordline WL 3 of the redundant array are not used (e.g., no memory address is mapped to the memory locations of wordline WL3 of the redundant array).

Skipping refresh operations for memory locations that are not used, such as when the memory locations are defective and the corresponding memory addresses have been remapped to memory locations of the redundant array, and/or memory locations of the redundant array do not have a memory address mapped thereto, may reduce power consumption by avoiding unnecessary refresh operations to unused memory locations.

Figure 3:
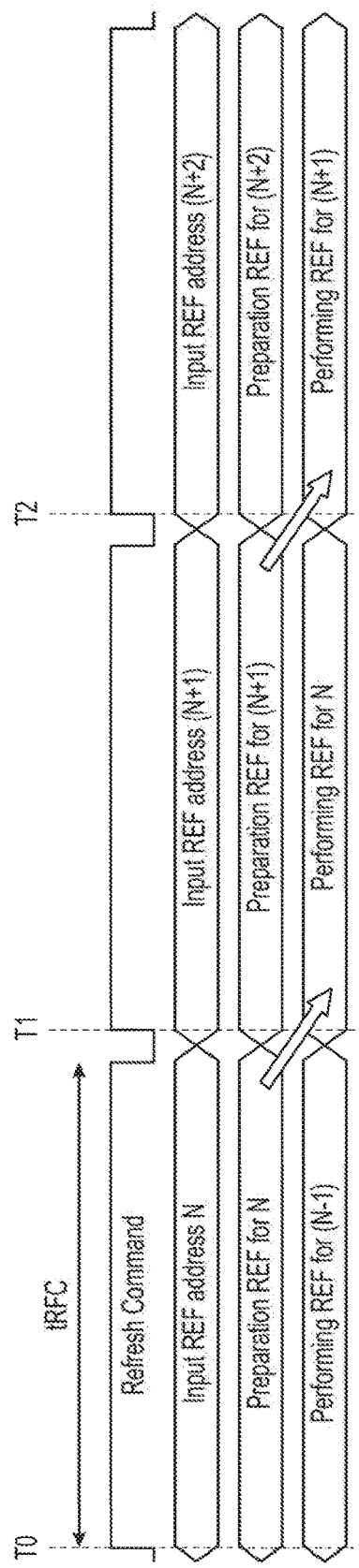
FIG. 3 is a timing diagram of performing refresh operations according to an embodiment of the disclosure.

FIG. 3 is a timing diagram of performing refresh operations according to an embodiment of the disclosure. The refresh operations of FIG. 3 may be used to refresh memory locations of the memory array 150 of the semiconductor device 100 of FIG. 1 in some embodiments of the disclosure.

At time TO, a first active refresh command (e.g., active high logic level) causes a refresh address N to be input and preparations for refresh operations for the refresh address N to be performed. The preparations for the refresh operations may include, for example, determining whether any of the refresh addresses related to the refresh address N match memory addresses stored in a redundancy circuit. The memory addresses stored may be memory addresses that are remapped to redundant memory locations. The refresh addresses related to the refresh address N may be compared to the stored memory addresses to determine whether any of the refresh address have been mapped to the redundant array. Also at time TO, responsive to the first active refresh command, refresh operations are performed for a previous refresh address, that is, refresh address (N−1). The refresh operations for the refresh address (N−1), as well as the input of the refresh address N and preparation for the refresh operations for the refresh address N are performed during refresh time tRFC. Prior to time T1, the first active refresh command becomes inactive by transitioning to a low logic level.

At time T1, a second active refresh command causes a refresh address (N+1) to be input and preparations for refresh operations for the refresh address (N+1) to begin. Also at time T1, responsive to the second active refresh command, a refresh operation is performed for the refresh address N, which was input responsive to the first active refresh command at time TO. The refresh operations for the refresh address N, as well as the input of the refresh address (N+1) and preparations for the refresh operations for the refresh address (N+1) are performed during refresh time tRFC following time T1. Prior to time T2, the second active refresh command becomes inactive by transitioning to a low logic level.

At time T2, a third active refresh command causes a refresh address (N+2) to be input and preparations for refresh operations for the refresh address (N+2) to begin. Also at time T2, responsive to the second active refresh command, a refresh operation is performed for the refresh address (N+1), which was input responsive to the second active refresh command at time T1. The third active refresh command becomes inactive by transitioning to a low logic level.

With reference to the refresh address N, inputting the refresh address and preparing for the refresh operations for the refresh address N responsive to a first active refresh command at time TO and then performing the refresh operations for the refresh address N responsive to a second active refresh command at time T1 allows the refresh operations for the refresh address N to be completed within the refresh time tRFC. Similarly, inputting the refresh address and preparing for the refresh operations for the refresh address (N+1) responsive to the second active refresh command at time T1 and then performing the refresh operations for the refresh address (N+1) responsive to the third active refresh command at time T2 allows the refresh operations for the refresh address (N+1) to be completed within the refresh time tRFC.

The refresh time tRFC may not be sufficient to input a refresh address, prepare for the refresh operations for the refresh address, and perform the refresh operations associated with the refresh address. The refresh time tRFC may have a maximum time that is set by a timing specification. Exceeding the refresh time tRFC for performing refresh operations for a refresh address may not be acceptable.

Figure 4:
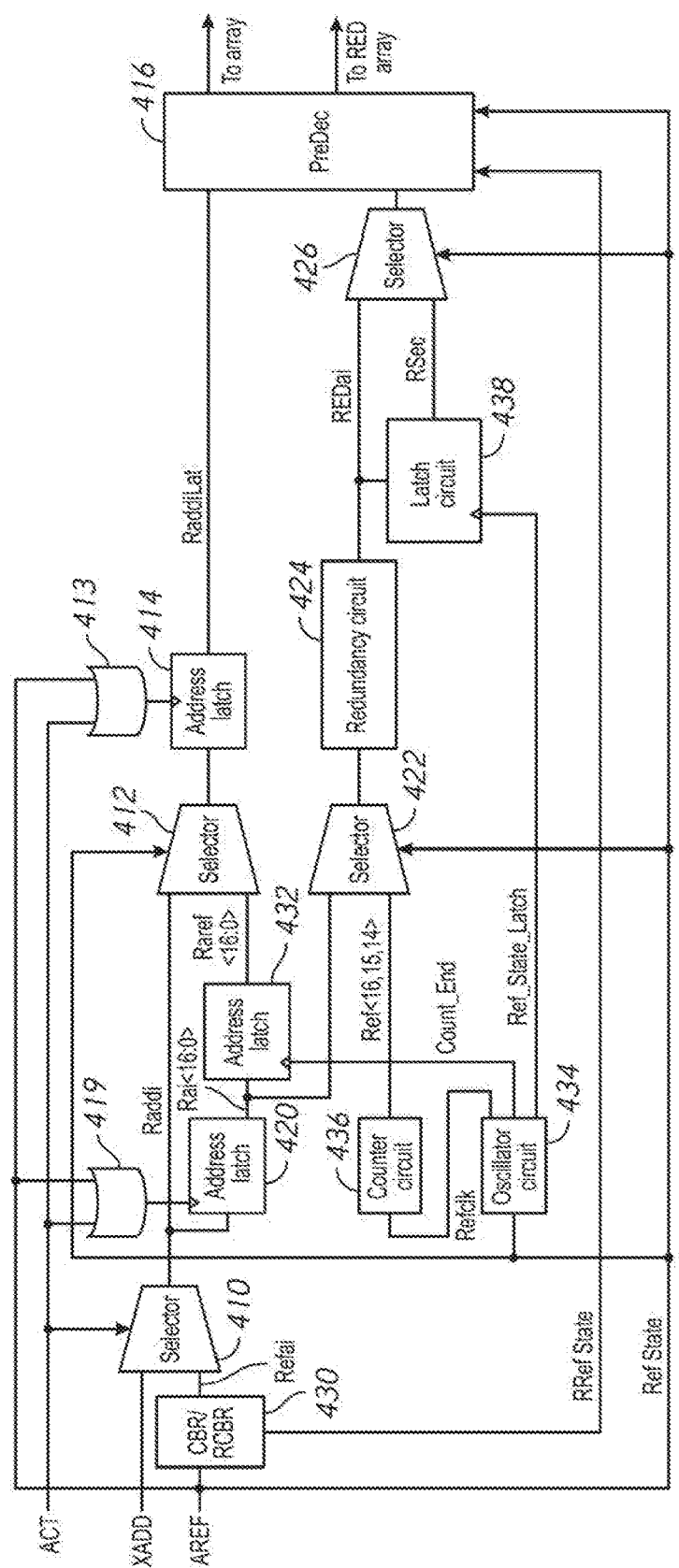
FIG. 4 is a refresh control circuit according to an embodiment of the disclosure.

FIG. 4 is a refresh control circuit 400 according to an embodiment of the disclosure. The refresh control circuit 400 may be included in the row address control circuit 140 of the semiconductor device 100 in some embodiments of the disclosure.

The refresh control circuit 400 receives an activation command ACT, a refresh command AREF and decoded row addresses XADD. The ACT command and the AREF command may be provided by a command decoder (e.g., command decoder 115 of semiconductor device 100).

The XADD addresses is provided to a selector circuit 410 that selects between providing the XADD addresses and a refresh address Refai from a refresh address counter circuit 430 as an address Raddi to a selector circuit 412 based on the ACT command. The refresh address counter 430 provides the XADD addresses when activated by the AREF command. The XADD address changes responsive to an active AREF command. For example, in some embodiments of the disclosure, the refresh address counter circuit 430 provides incrementing XADD addresses for active AREF commands. In other embodiments of the disclosure, the refresh address counter circuit 430 provides decrementing XADD addresses for active AREF commands.

The Raddi address is also provided to a latch circuit 420 that latches the Raddi address responsive to either the ACT command or the AREF command, which are provided through a logic gate 419 (e.g., an OR logic gate). The latched Raddi address is provided as a Rai address to a latch circuit 432 and to a selector circuit 422. The latch circuit 432 latches the Rai address responsive to a Count_End pulse provided by an oscillator circuit 434. The latched Rai address is provided to the selector circuit 412 as internal address Raref. The selector circuit 412 selects providing the Raddi or Raref address to the address latch 414. The address latch 414 latches the address from the selector circuit 412 responsive to either the ACT command or the AREF command, which are provided through a logic gate 413 (e.g., an OR logic gate). The latched address is provided to an address predecoder circuit 416. The address latches 420, 432, and 414 are a series of latch circuits through which addresses propagate to the address predecoder circuit 416, and as will be described in more detail below, provide the timing for preparing for refresh operations for a refresh address when an active AREF command is received, and then performing (or skipping) refresh operations to the refresh address when a subsequent active AREF command is received. The address predecoder circuit 416 controls whether a refresh operation is performed or skipped for a refresh address provided by the latch circuit 414 based on redundancy information provided by a redundancy circuit 424.

The oscillator circuit 434 is activated by the AREF command (provided as a Ref_State signal). When activated, the oscillator circuit 434 provides an oscillating output signal Ref_State_Latch, the Count_End pulse, and an oscillating output signal Refclk. An active Count_End pulse is provided by the oscillator circuit 434 every six oscillations of the Ref_State_Latch signal. The Refclk signal is provided to a counter circuit 436, which provides a count Ref<16,15,14>. The Ref<16,15,14> count may be a 3-bit count in some embodiments of the disclosure. However, in other embodiments of the disclosure, the count may include greater or fewer bits. Thus, the scope of the disclosure is not limited by the particular number of bits for the count provided by the counter circuit 436. The Ref<16,15,14> count changes responsive to the oscillating Refclk signal. For example, the Ref<16,15,14> count may increment responsive to the oscillating Refclk signal. In other embodiments of the disclosure, the Ref<16,15,14> count decrement. In some embodiments of the disclosure, the Ref<16,15,14> count increments from 000 to 101 (i.e., increments from 0 to 5) before returning to 000 to start incrementing again. Thus, in such embodiments of the disclosure, six different values are provided as the Ref<16,15,14> count. The Ref<16,15,14> count is provided to the selector circuit 422.

The selector circuit 422 provides the Rai address to the redundancy circuit 424 for ACT commands, and for AREF commands, combines the Ref<16,15,14> count with the Rai address and provides the combined address to the redundancy circuit 424. The redundancy circuit 424 compares the address from the selector circuit 422 with stored memory addresses to determine if the address from the selector circuit 422 matches one of the stored memory addresses. As previously described, the stored memory addresses may be memory addresses that are remapped to redundant memory locations. Memory addresses that have been mapped to redundant memory, for example, for repairing defective memory locations, are stored and compared to incoming memory addresses to determine whether to access original memory locations or redundant memory. In some embodiments of the disclosure the stored memory addresses are stored by the redundancy circuit 424, whereas in other embodiments of the disclosure the stored memory addresses are stored by a storage circuit that is accessible by the redundancy circuit 424. The redundancy circuit 424 provides redundancy information REDai indicative of whether a match is determined between a current refresh address represented by the Rai address and the Ref<16,15,14> addresses matches a store memory address. The memory addresses may be stored in nonvolatile storage circuits. For example, in some embodiments of the disclosure, the memory addresses are programmed in fuse circuits (and/or antifuse circuits). The fuse circuits may be included in the redundancy circuit 424 in some embodiments of the disclosure.

The redundancy information REDai is provided to a selector circuit 426 and is also provided to latch circuit 438. The latch circuit 438 latches the redundancy information REDai responsive to the Ref_State_Latch signal from the oscillator circuit 434 to be provided as a redundancy flag RSec. The state of the RSec flag is indicative of whether the redundancy information REDai indicates a match between a current refresh address and a stored memory address or not. The RSec flag is provided to the selector circuit 426, which provides either the REDai signal or RSec flag to the address predecoder circuit 416 based on the AREF command (represented by the Ref_State signal). A control signal RRef_State is also provided to the address predecoder circuit 416, which is provided by the refresh address counter circuit 430. The RRef_State signal indicates whether the refresh addresses provided by the refresh address counter circuit 430 are for memory locations of the regular array or the redundant array.

The address predecoder circuit 416 provides activation signals to perform or skip refresh operations to refresh memory locations in the regular array and the redundant array based on the redundancy information from the selector circuit 426 and the RRef_State and Ref_State signals.

During an access operation, an activation command ACT is provided to the refresh control circuit 400. When the activation command ACT is active (and the refresh command AREF is inactive), the decoded row address XADD is provided through the selector circuit 410 and through the selector circuit 412 to latch circuit 414 as the internal address Raddi. The decoded row address XADD may be provided by an address decoder (e.g., address decoder 112 of semiconductor device 100). The latch circuit 414 latches the Raddi address responsive to the active ACT command. The latched Raddi address is provided as internal address RaddiLat to an address predecoder circuit 416. The Raddi address is also provided to latch circuit 420 which latches the Raddi address responsive to the active ACT command. The latched Raddi address is provided by the latch circuit 420 as internal address Rai through selector circuit 422 to redundancy circuit 424. The Raddi address is provided to the redundancy circuit 424 (as the Rai address) to determine whether the Raddi address matches a stored memory address. As previously described, memory addresses that have been mapped to redundant memory, for example, for repairing defective memory locations, are stored and compared to incoming memory addresses to determine whether to access original memory locations or redundant memory.

If the redundancy circuit 424 determines that the Rai address does not match a stored memory address, redundancy information REDai that indicates a match was not determined is provided through the selector circuit 426 to the address predecoder circuit 426. The RaddiLat address provided by the address predecoder circuit 426 is accessed based on the redundancy information from the redundancy circuit 424 indicating that a match was not detected. However, if the Rai address matches a stored memory address stored by the redundancy circuit 424, redundancy information REDai that indicates a match is determined is provided through the selector circuit 426 to the address predecoder circuit 426. The memory address for the redundant memory location to which the Rai address is mapped is provided for access based on the redundancy information from the redundancy circuit 424 indicating that a match was determined.

Figure 5:
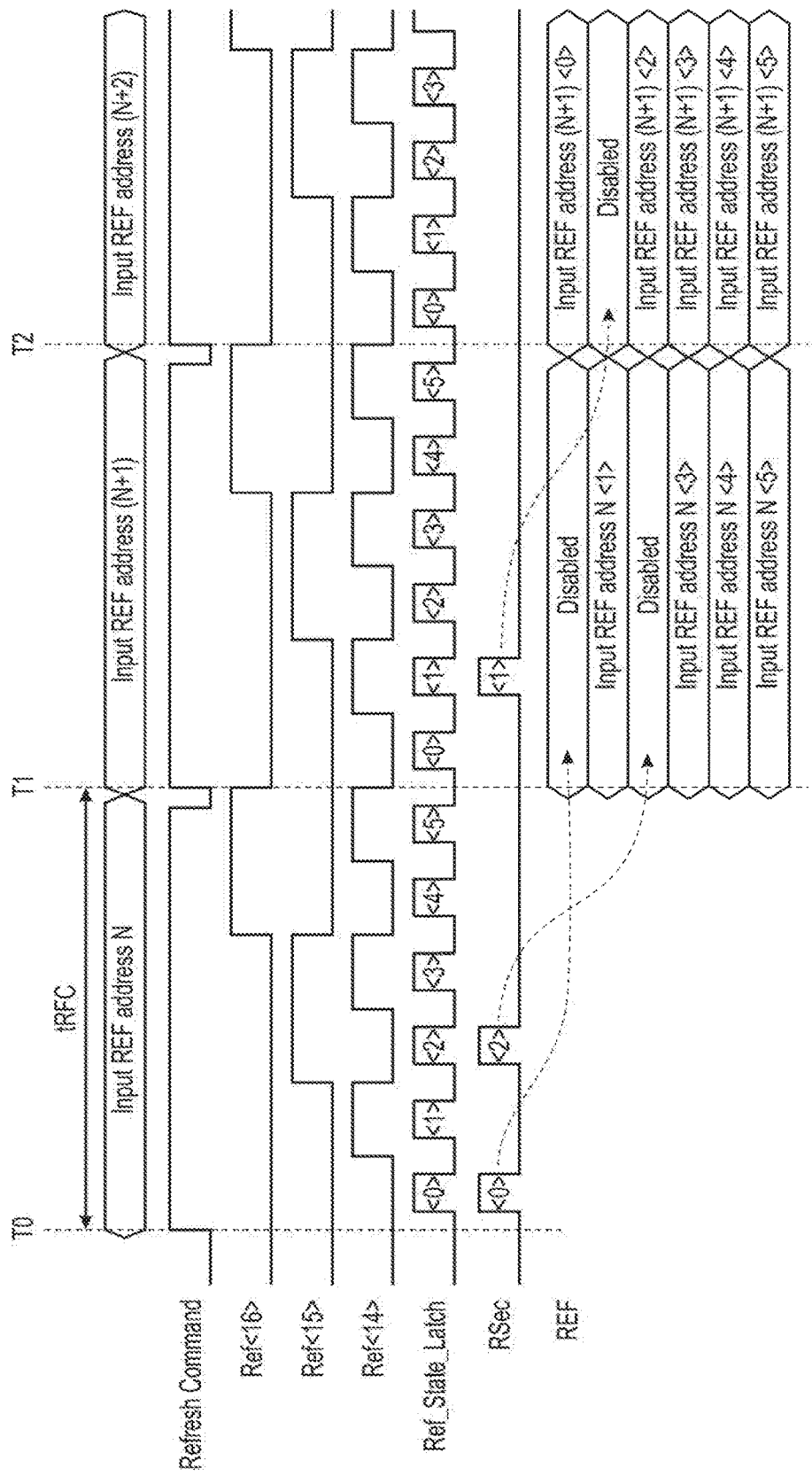
FIG. 5 is a timing diagram of refresh operations according to an embodiment of the disclosure.

Operation of the refresh control circuit 400 for refresh operations will be described with reference to FIG. 5. FIG. 5 is a timing diagram for refresh operations according to an embodiment of the disclosure. The refresh operations of FIG. 5 may be controlled by the refresh control circuit 400 of FIG. 4 in some embodiments of the disclosure.

FIG. 5 illustrates active refresh commands (e.g., AREF) provided to the refresh control circuit 400, the Ref<16>, Ref<15>, and Ref<14> address provided by the counter circuit 436, the Ref_State_Latch signal provided by the oscillator circuit 434, and the RSec flag provided by the latch circuit 438. The RRef_State signal provided by the refresh address counter circuit 430 is a first logic level, indicating to the address predecoder circuit 416 that the refresh address provided are for memory locations of the regular array.

At time T0 a first active refresh command causes a refresh address N to be input. The refresh address N is provided by the refresh address counter circuit 430 through the selector circuit 410 to be latched by the latch circuit 420. The refresh address N is provided by the latch circuit 420 to the selector circuit 422 as the Rai address. The first active refresh command also enables the oscillator circuit 434 to provide the Refclk signal to the counter circuit 436 and to provide the Ref_State_Latch signal to the latch circuit 438.

As previously described with reference to FIG. 4, the Refclk signal is an oscillating signal that causes the counter circuit 436 to increment the 3-bit count Ref<16, 15, 14> from 000 to 101 (i.e., from 0 to 5) before returning to 000 to start incrementing again. The incrementing Ref<16>, Ref<15>, and Ref<14> count is shown in FIG. 5, incrementing from 000, through 001, 010, 011, 100, and 101 before returning to 000. The Ref<16,15,14> count is provided to the selector circuit 422 to be combined with 14-bits of the latched refresh address (provided as the Rai address) from the latch circuit 420 to provide a 17-bit refresh address. For example, Rai<13:0> (14-bits) is combined with the Ref<16,15,14> count by the selector circuit 422 for refresh operations to provide a 17-bit refresh address. Incrementing the Ref<16,15,14> count from 000 to 101 provides six different 17-bit refresh addresses related to one 14-bit refresh address provided by the refresh address counter circuit 430.

The 17-bit refresh address from the selector circuit 422 is provided to the redundancy circuit 424, which compares the 17-bit refresh address with memory addresses stored by the redundancy circuit 424. The redundancy circuit 424 provides redundancy information having a logic value that indicates whether there is a match between a current 17-bit refresh address and a stored memory address. For example, the redundancy circuit 424 provides high logic level redundancy information when there is a match between the current 17-bit refresh address and a stored memory address, and provides low logic level redundancy information when there is not a match. As the Ref<16,15,14> count changes, each new resulting 17-bit refresh address is provided to and compared by the redundancy circuit 424 to provide respective redundancy information for each 17-bit refresh address. In this manner, the refresh addresses provided to the redundancy circuit 424 are determined one by one whether it matches a stored memory address (e.g., corresponds to defective memory and has been mapped to redundant memory).

The redundancy information is latched by the latch circuit 438 responsive to the Ref_State_Latch signal, which is an oscillating signal provided by the enabled oscillator circuit 434. The oscillating Ref_State_Latch signal is shown in FIG. 5 and the positive pulses of the Ref_State_Latch signal are identified by a value corresponding to the Ref<16,15,14> count (e.g., <0>, <1>, <2>, <3>, <4>, and <5>). As a result, the latch circuit 438 latches the redundancy information for each different 17-bit refresh address provided to the redundancy circuit 424. The latch circuit 438 provides the latched redundancy information for each 17-bit refresh address as the RSec flag through the selector circuit 426 to the address predecoder circuit 416.

In the example of FIG. 5, the 17-bit refresh address for [refresh address N+Ref<16,15,14> of 000] is determined by the redundancy circuit 424 to match a stored memory address, as indicated by the high logic level RSec flag corresponding to pulse <0> of the Ref_State_Latch. The Ref<16,15,14> count increments to 001 responsive to the Refclk signal provided by the oscillator circuit 434 to provide a new refresh address for comparison by the redundancy circuit 424. The 17-bit refresh address for [refresh address N+Ref<16,15,14> of 001] is determined by the redundancy circuit 424 to not match a stored memory address, as indicated by the low logic level RSec flag corresponding to pulse <1> of the Ref_State_Latch. The Ref<16,15,14> count increments again responsive to the Refclk signal to 010 to provide a new refresh address to the redundancy circuit 424. The 17-bit refresh address for [refresh address N+Ref<16,15,14> of 010] is determined by the redundancy circuit 424 to match a stored memory address, as indicated by the high logic level RSec flag corresponding to pulse <2> of the Ref_State_Latch. The incrementing of the Ref<16,15,14> count and the comparison of the resulting 17-bit address with stored memory addresses by the redundancy circuit 424 continues for the refresh addresses [refresh address N+Ref<16,15,14> of 011], [refresh address N+Ref<16,15,14> of 100], and [refresh address N+Ref<16,15,14> of 101].

In summary for the example of FIG. 5, the refresh addresses [refresh address N+Ref<16,15,14> of 000] and [refresh address N+Ref<16,15,14> of 010] are determined by the redundancy circuit 424 to match a stored memory address, whereas the refresh addresses [refresh address N+Ref<16,15,14> of 001], [refresh address N+Ref<16,15, 14> of 011], [refresh address N+Ref<16,15,14> of 100], and [refresh address N+Ref<16,15,14> of 101] are determined by the redundancy circuit 424 to not match any of the stored memory addresses.

As previously described, the corresponding RSec flags for the refresh addresses are provided to the address predecoder circuit 416. The address predecoder circuit 416 controls whether a refresh operation is performed or skipped for a refresh address provided by the latch circuit 414 based on the RSec flag. For example, the address predecoder circuit 416 causes a refresh operation to be performed for the refresh address provided by the latch circuit 414 when the RSec flag is a low logic level (e.g., there is not a match). In contrast, the address predecoder circuit 416 causes a refresh operation to be skipped for the refresh address provided by the latch circuit 414 when the RSec flag is a high logic level (e.g., there is a match). In this manner, memory locations corresponding to the refresh address resulting from the combination of the refresh address provided by the latch circuit 414 and the Ref<16,15,14> count are refreshed when they are used (e.g., the refresh address does not match a stored memory address), but are not refreshed when the memory locations are not used (e.g., the memory locations are defective and the memory address corresponding to the defective memory locations is mapped to memory locations in redundant memory).

As also previously described, the oscillator circuit 434 provides a positive Count_End pulse to the latch circuit 432 every six oscillations of the Refclk signal (or the Ref_State_Latch signal). The Count_End pulse causes the latch circuit 432 to latch the Rai address (e.g., the current refresh address from the refresh address counter circuit 430) and provide the latched refresh address to the latch circuit 414 through the selector circuit 412.

In the example of FIG. 5, the oscillator circuit 434 provides the Count_End pulse (not shown) to cause the latch circuit 432 to latch the refresh address N (which is provided by the latch circuit 420 as the Rai address) and provide the latched refresh address N to the latch circuit 414 through the selector circuit 412 prior to a subsequent active refresh command at time T1. For example, in some embodiments of the disclosure, the Count_End pulse is provided at the sixth pulse of the Refclk signal provided to the counter circuit 436. AS a result, the Count_End pulse may be provided by the oscillator circuit 434 corresponding to when the Ref<16, 15,14> count is about to roll over from 101 to 000. In other embodiments of the disclosure, the Count_End pulse may be provided at a different time after the refresh address N has been latched by the latch circuit 420 and before the subsequent active refresh command at time T1.

To summarize, following time T0 and prior to time T1, the six refresh addresses resulting from the combination of refresh address N and the Ref<16,15,14> count have been compared with stored memory addresses by the redundancy circuit 424 to provide redundancy information for each of the six refresh addresses associated with the refresh address N. The redundancy information for each of the six refresh addresses associated with the refresh address N and sequentially latched by the latch circuit 438 and provided to the address predecoder circuit 416 as six RSec flags. Additionally, the refresh address N is latched by the latch circuit 432 and provided to the latch circuit 414, and the first active refresh command becomes inactive.

At time T1, a second active refresh command is provided. The second active refresh command causes the latch circuit 414 to latch the refresh address N (provided by the latch circuit 432 through the selector circuit 412) and provide the latched refresh address N to the address predecoder circuit 416. Based on the RSec flags for the six addresses associated with the refresh address N provided to the address predecoder circuit 416 between times T0 and T1, the address predecoder circuit 416 causes refresh operations to be performed for the refresh addresses having a low logic level RSec flag and causes refresh operations to be skipped for the refresh addresses having a high logic RSec flag. In this manner, refresh operations for the refresh addresses associated with the refresh address N are performed after preparations for the refresh operations are completed (e.g., preparation between times T0 and T1), and the refresh operations may be performed between times T1 and T2. Additionally, refresh operations for refresh addresses that correspond to memory locations that are not used (e.g., defective memory locations that have been remapped to redundant memory) are skipped. In the example of FIG. 5, refresh operations for refresh addresses [refresh address N+Ref<16,15,14> of 001] and [refresh address N+Ref<16,15,14> of 011] through [refresh address N+Ref<16,15,14> of 101] are performed and refresh operations for refresh addresses [refresh address N+Ref<16,15,14> of 000] and [refresh address N+Ref<16, 15,14> of 010] are skipped.

In some embodiments of the disclosure, refresh operations for the memory locations of the refresh addresses (that are not skipped) are performed concurrently. For example, the memory locations of refresh addresses [refresh address N+Ref<16,15,14> of 001] and [refresh address N+Ref<16, 15,14> of 011] through [refresh address N+Ref<16,15,14> of 101] are performed concurrently. In some embodiments of the disclosure, the memory locations of the refresh addresses (that are not skipped) are performed sequentially. For example, the memory locations of refresh address [refresh address N+Ref<16,15,14> of 001] are refreshed, and then the memory locations of refresh address [refresh address N+Ref<16,15,14> of 011] are refreshed, and then the memory locations of refresh address [refresh address N+Ref<16,15,14> of 100] are refreshed, and so on. In some embodiments of the disclosure, the refresh operations for the memory locations of the refresh addresses (that are not skipped) are started at different times, but overlap. The manner in which the memory locations of refresh addresses related to a base refresh address is not intended to limit the scope of the disclosure.

Also at time T1 the second active refresh command causes the refresh address counter circuit 430 to provide a refresh address (N+1) to be input. The preparations for refresh operations previously described for the refresh address N that were performed between times T0 and T1 are repeated for the refresh address (N+1) between times T1 and T2. For example, between times T1 and 72, the six refresh addresses resulting from the combination of refresh address (N+1) and the Ref<16,15,14> count are compared with stored memory addresses by the redundancy circuit 424 to provide redundancy information for each of the six refresh addresses associated with the refresh address (N+1). The redundancy information for each of the six refresh addresses associated with the refresh address (N+1) are sequentially latched by the latch circuit 438 and provided to the address predecoder circuit 416 as six RSec flags. Additionally, the refresh address (N+1) is latched by the latch circuit 432 and provided to the latch circuit 414, and the second active refresh command becomes inactive. In the example of FIG. 5, the refresh addresses [refresh address (N+1)+Ref<16,15, 14> of 001] is determined by the redundancy circuit 424 to match a stored memory address (as indicated by a high logic level RSec signal corresponding to pulse <1> of the Ref_State_Latch), whereas the refresh addresses [refresh address (N+1)+Ref<16,15,14> of 000] and [refresh address (N+1)+Ref<16,15,14> of 010] through [refresh address (N-+1)+Ref<16,15,14> of 101] are determined by the redundancy circuit 424 to not match any of the stored memory addresses (as indicated by low logic level RSec signals corresponding to pulses <0> and <1> through <5> of the Ref_State_Latch).

At time T2, a third active refresh command causes the latch circuit 414 to latch the refresh address (N+1) (provided by the latch circuit 432 through the selector circuit 412) and provide the latched refresh address (N+1) to the address predecoder circuit 416. Based on the RSec flags for the six addresses associated with the refresh address (N+1) provided to the address predecoder circuit 416 between times T1 and T2, the address predecoder circuit 416 causes refresh operations to be performed for the refresh addresses having a low logic level RSec flag and causes refresh operations to be skipped for the refresh addresses having a high logic RSec flag. In this manner, refresh operations for the refresh addresses associated with the refresh address (N+1) are performed after preparations for the refresh operations are completed (e.g., preparation between times T1 and T2), and the refresh operations may be performed between times T2 and T3. Additionally, refresh operations for refresh addresses that correspond to memory locations that are not used (e.g., defective memory locations that have been remapped to redundant memory) are skipped. In the example of FIG. 5, refresh operations for refresh addresses [refresh address (N+1)+Ref<16,15,14> of 000], and [refresh address (N+1)+Ref<16,15,14> of 010] through [refresh address (N+1)+Ref<16,15,14> of 101] are performed and refresh operations for refresh address [refresh address (N+1)+Ref<16,15,14> of 001] is skipped.

Also at time T2 the third active refresh command causes the refresh address counter circuit 430 to provide a refresh address (N+2) to be input. The preparations for refresh operations previously described for the refresh addresses N and (N+1) that were performed between times T0 and T1 and between times T1 and T2 are repeated for the refresh address (N+2) following time T2 in anticipation of the refresh operations for the refresh addresses associated with the refresh address (N+2) to be performed after preparations are completed. The refresh operations for the refresh addresses associated with the refresh address (N+2) may be performed responsive to a subsequent active refresh command.

Following the refresh operations for memory locations of the regular array, refresh operations for memory locations of the redundant array are performed, as previously described with reference to FIG. 2. The RRef_State signal from the refresh address counter 430 changes to a second logic level indicating to the address predecoder circuit 416 that the refresh address provided are for memory locations of the redundant array. Operation of the refresh control circuit 400 for refresh operations for memory locations of the redundant array are similar to that described for refresh operations for memory locations of the regular array. As a result, refresh operations for memory locations of the redundant array that are not used are skipped, while refresh operations for memory locations of the redundant array that are used (e.g., have a memory address mapped thereto) are performed.

As described for various embodiments of the disclosure, refresh addresses may be determined to be mapped to redundant memory (e.g., when the corresponding memory locations in the regular array are defective) one by one, and refresh operations for memory locations of the regular array and the redundant array that are not used (e.g., are defective and have a corresponding memory address remapped to redundant memory) may be skipped, while refresh operations for memory locations of the regular array and the redundant array that are used are performed. Thus, unnecessary refresh operations to memory locations that are not used may be avoided.

From the foregoing it will be appreciated that, although specific embodiments of the disclosure have been described herein for purposes of illustration, various modifications may be made without deviating from the spirit and scope of the disclosure. Accordingly, the scope of the disclosure should not be limited any of the specific embodiments described herein.

What is claimed is:

1. An apparatus, comprising:
   a refresh counter circuit configured to provide a refresh address responsive a first active refresh command;
   a first latch circuit configured to latch the refresh address and provide a first latched refresh address;
   an address counter circuit configured to provide a count, wherein the count changes responsive to an oscillating signal;
   a redundancy circuit configured to receive the first latched refresh address and the count as a combined address, the redundancy circuit further configured to provide redundancy information indicative of whether the combined address matches any of a plurality of stored addresses;
   a redundancy information latch circuit configured to latch the redundancy information responsive to the oscillating signal and provide the latched redundancy information;
   a second latch circuit configured to latch the first latched refresh address responsive to a number of oscillations of the oscillating signal and provide a second latched refresh address;
   a third latch circuit configured to latch the second latched refresh address responsive to a second active refresh command and provide a third latched address; and
   an address predecoder circuit configured to receive the latched redundancy information and the third latched refresh address and perform or skip a refresh operation to the third latched refresh address based on the latched redundancy information.

2. The apparatus of claim 1 wherein the redundancy circuit is configured to compare the combined address with the plurality of stored addresses and provide the redundancy information based on the comparison.

3. The apparatus of claim 1 wherein the refresh counter circuit is further configured to provide a control signal to the address predecoder circuit that indicates whether the refresh address provided is for memory locations of the regular array or for a redundant array.

4. The apparatus of claim 1 wherein the address counter is configured to increment the count responsive to the oscillating signal and rollover to an initial count value from a maximum count value and wherein the number of oscillations of the oscillating signal corresponds to the maximum count value.

5. An apparatus, comprising:
   a memory array including a regular array and a redundant array;
   a row address control circuit configured to refresh memory locations of the memory array responsive to refresh commands, wherein the row address control circuit includes a control circuit configured to latch a first refresh address for first memory locations in the memory array responsive to a first refresh command and prepare for a first refresh operation of the first memory locations, and further configured to latch a second refresh address for second memory locations in the memory array responsive to a second refresh command and prepare for a second refresh operation of the second memory locations, and to perform the first refresh operation responsive to the second refresh command.

6. The apparatus of claim 5 wherein the row address control circuit comprises:
   a first latch configured to latch the first refresh address responsive to the first refresh command and to latch the second refresh address responsive to the second refresh command;
   a redundancy circuit configured to receive the latched first refresh address and prepare for the first refresh operation of the first memory locations and provide first redundancy information for the first refresh address to control the refresh operation of the first memory locations, and further configured to thereafter receive the latched second refresh address and prepare for the second refresh operation the second memory locations and provide redundancy information for the second refresh address to control the refresh operation of the second memory locations;

a second latch circuit configured to latch the latched first refresh address from the first latch responsive to the second refresh command and to provide the first latched refresh address; and an address predecoder circuit configured to receive the redundancy information and the first latched refresh address and perform or skip refresh operations for one or more of the first memory locations based on the redundancy information.

7. The apparatus of claim 5 wherein as part of preparing for the first refresh operation, the row address control circuit is configured to compare a plurality of refresh addresses associated with the first refresh address with saved memory addresses, and further configured to skip refresh operations for memory locations of the first memory locations corresponding to a refresh address that matches a memory address of the saved memory addresses and to perform refresh operations for memory locations of the first memory locations corresponding to a refresh address that does not match a memory address of the saved memory addresses.

8. The apparatus of claim 5 wherein the row address control circuit comprises a counter circuit configured to provide a plurality of count values, wherein the first refresh address is combined with each of the plurality of count values to provide a first plurality of refresh addresses, each of the first plurality of refresh addresses corresponds to a respective one of the first memory locations.

9. The apparatus of claim 8 wherein the row address control circuit is configured to refresh memory locations corresponding to the first plurality of refresh addresses except for defective memory locations.

10. An apparatus, comprising:
a memory array including a regular array and a redundant array;
a refresh control circuit coupled to the memory array and configured to refresh memory cells of the regular array and the redundant array, wherein the refresh control circuit is configured to produce a plurality of refresh addresses responsive to a first refresh command and to detect whether the plurality of refresh addresses include defective addresses and non-defective addresses, and the refresh control circuit further configured to refresh the non-defective addresses without refreshing the defective addresses responsive to a second refresh command, wherein the refresh control circuit comprises:
a refresh address counter configured to provide a portion of a refresh address; and
a counter circuit configured to provide a plurality of counts that are each combined with the portion of the refresh address to produce the plurality of refresh addresses.

11. The apparatus of claim 10 wherein the refresh control circuit comprises:
a first latch circuit configured to latch the portion of the refresh address and provide the same responsive to the first refresh command;
a second latch circuit configured to latch the portion of the refresh address from the first latch circuit once for the plurality of counts and provide the latched portion of the refresh address; and
a third latch circuit configured to latch the portion of the refresh address from the second latch circuit and provide the same responsive to the second refresh command.

12. The apparatus of claim 10 wherein the refresh control circuit further comprises an oscillator circuit configured to provide an oscillating signal that causes the counter circuit to increment through the plurality of counts.

13. The apparatus of claim 10 wherein the refresh control circuit comprises a redundancy circuit configured to store a plurality of defective addresses and to compare each of the plurality of first refresh addresses to the stored plurality of defective addresses to detect whether the plurality of first refresh addresses include defective addresses and non-defective addresses.

* * * * *